(12) United States Patent
Imam et al.

(10) Patent No.: US 11,322,491 B1
(45) Date of Patent: May 3, 2022

(54) INTEGRATED GRID CELL

(71) Applicant: NXP USA, Inc., Austin, TX (US)

(72) Inventors: Raza Imam, Ghaziabad (IN); Naveen Kumar, Distt.-Jhajjar (IN); Shreyans Jain, Delhi (IN)

(73) Assignee: NXP USA, Inc., Austin, TX (US)

( * ) Notice: Subject to any disclaimer, the term of this patent is extended or adjusted under 35 U.S.C. 154(b) by 21 days.

(21) Appl. No.: 17/071,909

(22) Filed: Oct. 15, 2020

(51) Int. Cl.
   *H01L 27/02* (2006.01)
   *H01L 21/8234* (2006.01)
   *H01L 23/522* (2006.01)

(52) U.S. Cl.
   CPC .. *H01L 27/0207* (2013.01); *H01L 21/823475* (2013.01); *H01L 23/5223* (2013.01); *H01L 23/5226* (2013.01)

(58) Field of Classification Search
   CPC ......... H01L 27/0207; H01L 21/823475; H01L 23/5223; H01L 23/5226
   USPC ....................................................... 257/401
   See application file for complete search history.

(56) References Cited

U.S. PATENT DOCUMENTS

| | | | |
|---|---|---|---|
| 6,504,777 B1 * | 1/2003 | Hsu | G11C 7/12 365/202 |
| 8,640,074 B2 | 1/2014 | Huang et al. | |
| 9,465,899 B2 | 10/2016 | Sundareswaran et al. | |
| 9,768,119 B2 | 9/2017 | Yu et al. | |
| 10,497,794 B1 | 12/2019 | Jarrar et al. | |

* cited by examiner

*Primary Examiner* — Tu-Tu V Ho

(57) ABSTRACT

An integrated grid cell on an integrated circuit (IC) is disclosed. The integrated grid cell corresponds to at least one of an integrated one-grid cell and an integrated two-grid cell. The integrated grid cell includes various polysilicon layers, metal-0 oxide diffusion (M0OD) layers, and a metal-0 polysilicon (M0PO) layer. The polysilicon layers, the M0OD layers, and the M0PO layer are formed such that potential differences are created between one or more polysilicon layers and one or more M0OD layers. Such potential differences between the one or more polysilicon layers and the one or more M0OD layers lead to formation of various parasitic capacitors between the one or more polysilicon layers and the one or more M0OD layers. The parasitic capacitors correspond to decoupling capacitors that mitigate a dynamic IR drop and a supply noise associated with the IC.

20 Claims, 7 Drawing Sheets

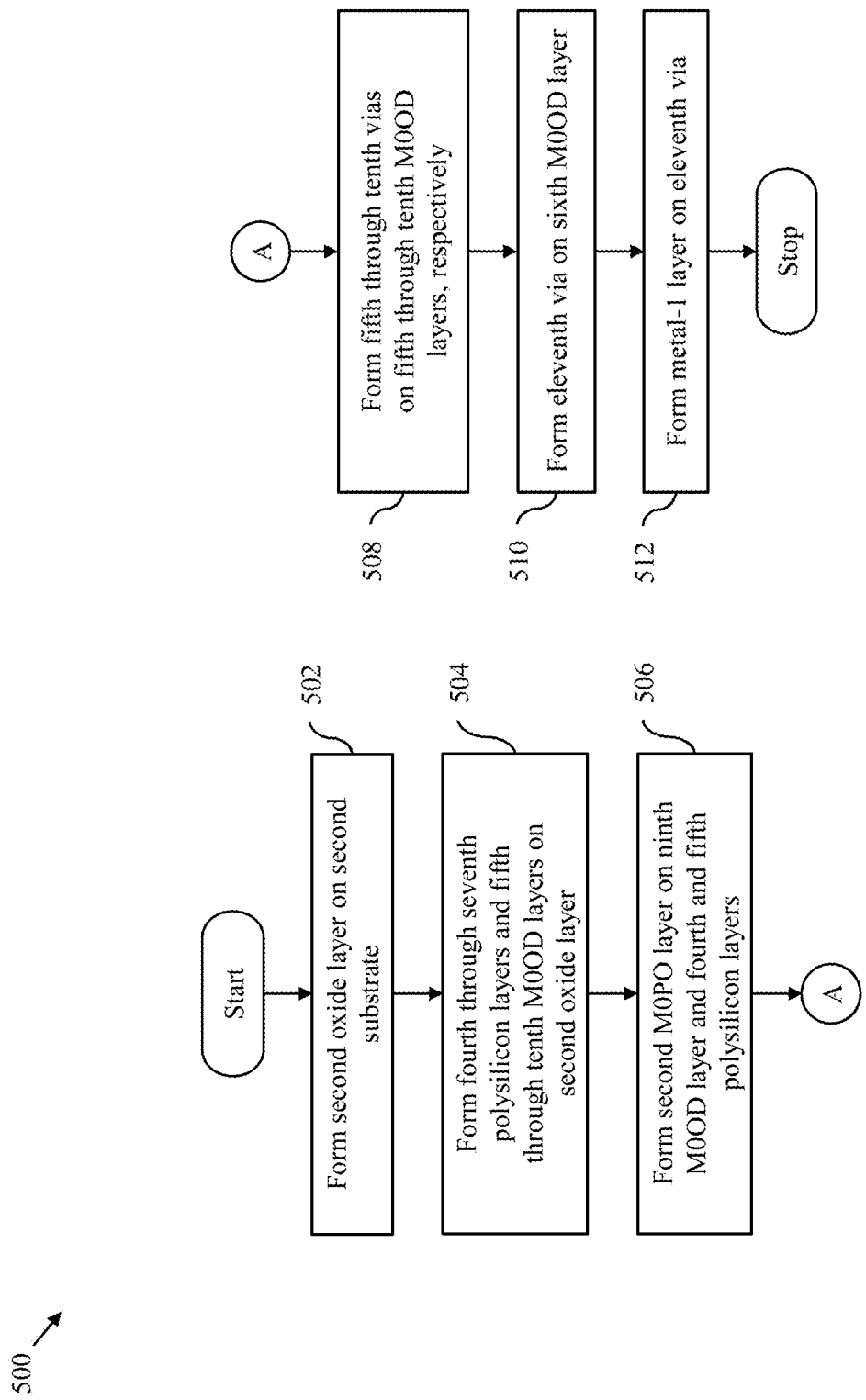

INTEGRATED GRID CELL

BACKGROUND

The present disclosure relates generally to electronic design, and, more particularly, to integrated one-grid and two-grid cells.

An integrated circuit (IC) typically includes various functional cells (e.g., flip-flops, multiplexers, or the like). In an IC layout, abutment of such functional cells leads to design rule checks (DRC) violation. Hence, the functional cells are typically placed such that gaps are formed therebetween. Such gaps may be one-grid gaps, two-grid gaps, three-grid gaps, or the like. A grid is a unit of measurement in a layout, and corresponds to a lateral distance between the functional cells. Such gaps lead to discontinuity between the functional cells. Further, switching activity of transistors included in the functional cells leads to a significant increase in a dynamic IR drop and a supply noise associated with the IC. Filler cells are typically used in the IC layout for providing continuity between the functional cells as the filler cells may be placed in gaps of various sizes (e.g., one-grid gaps, two-grid gaps, three-grid gaps, or the like), and may be abutted with the functional cells without violating DRC. However, the filler cells are unable to mitigate the dynamic IR drop and the supply noise. Hence, the filler cells in the IC layout are typically replaced with cells functioning as decoupling capacitors that mitigate the dynamic IR drop and the supply noise. Such cells have a metal-oxide-semiconductor (MOS) structure, and are referred to as MOS decap cells.

The MOS structure (i.e., source and drain terminals and a channel formed therebetween) however limits a minimum size (i.e., width) of the MOS decap cells. In an example, a minimum size of a MOS decap cell is three grids. Thus, exclusively the filler cells of sizes three grids or more are replaceable with the MOS decap cells. The IC layout, however, includes a significant number of one-grid and two-grid filler cells. Thus, there is a limitation to the degree of the dynamic IR drop and supply noise mitigation that is provided by the MOS decap cells. Further, for the functional cells operating at high toggling frequencies (e.g., frequencies greater than 1 gigahertz), abutment with the MOS decap cells is essential for mitigating the dynamic IR drop and the supply noise associated therewith. This leads to a significant increase in a size and a manufacturing cost of the IC. Therefore, there exists a need for a technical solution that solves the afore-mentioned problems of filler cells and MOS decap cells.

SUMMARY

In one embodiment of the present disclosure, an integrated one-grid cell is disclosed. The integrated one-grid cell includes a first polysilicon layer and first through fourth metal-0 oxide diffusion (M0OD) layers. The first and second M0OD layers are formed parallel to a first portion of the first polysilicon layer on first and second sides of the first polysilicon layer, respectively, and the third and fourth M0OD layers are formed parallel to a second portion of the first polysilicon layer on the first and second sides of the first polysilicon layer, respectively. The first and second sides are opposite sides of the first polysilicon layer. Further, the first and third M0OD layers are aligned with each other, and the second and fourth M0OD layers are aligned with each other. The integrated one-grid cell further includes a metal-0 polysilicon (M0PO) layer that is formed on the third and fourth M0OD layers and the first polysilicon layer to form an electrical contact between the third and fourth M0OD layers and the first polysilicon layer. The first and second M0OD layers are coupled with a first supply rail, and the third and fourth M0OD layers are coupled with a second supply rail such that a first parasitic capacitor is formed between the first M0OD layer and the first polysilicon layer, and a second parasitic capacitor is formed between the second M0OD layer and the first polysilicon layer.

In another embodiment of the present disclosure, a method for forming an integrated one-grid cell is disclosed. The method includes forming a first polysilicon layer and first through fourth metal-0 oxide diffusion (M0OD) layers on an oxide layer. The first and second M0OD layers are formed parallel to a first portion of the first polysilicon layer on first and second sides of the first polysilicon layer, respectively, and the third and fourth M0OD layers are formed parallel to a second portion of the first polysilicon layer on the first and second sides of the first polysilicon layer, respectively. The first and second sides are opposite sides of the first polysilicon layer. Further, the first and third M0OD layers are aligned with each other, and the second and fourth M0OD layers are aligned with each other. The method further includes forming a metal-0 polysilicon (M0PO) layer on the third and fourth M0OD layers and the first polysilicon layer to form an electrical contact therebetween. A first parasitic capacitor is formed between the first M0OD layer and the first polysilicon layer, and a second parasitic capacitor is formed between the second M0OD layer and the first polysilicon layer based on: (i) the electrical contact between the third and fourth M0OD layers and the first polysilicon layer, (ii) an electrical contact between the first and second M0OD layers and a first supply rail, and (iii) an electrical contact between the third and fourth M0OD layers and a second supply rail.

In some examples, the integrated one-grid cell further includes the first and second vias formed on the first and second M0OD layers, respectively. The first and second M0OD layers are coupled with the first supply rail by way of the first and second vias, respectively. An electrical contact is formed between the first and second M0OD layers and the first supply rail by way of the first and second vias, respectively.

In some examples, the integrated one-grid cell further includes third and fourth vias formed on the third and fourth M0OD layers, respectively. The third and fourth M0OD layers are coupled with the second supply rail by way of the third and fourth vias, respectively. An electrical contact is formed between the third and fourth M0OD layers and the second supply rail by way of the third and fourth vias, respectively.

In some examples, the integrated one-grid cell further includes second and third polysilicon layers that are formed parallel to the first polysilicon layer such that the first and third M0OD layers are formed between the first and second polysilicon layers, and the second and fourth M0OD layers are formed between the first and third polysilicon layers.

In some examples, the integrated one-grid cell is on an integrated circuit, and a distance between the second and third polysilicon layers is equal to one grid of the integrated circuit.

In some examples, the integrated one-grid cell further includes a substrate and an oxide layer that is formed on the substrate. The first through fourth M0OD layers and the first through third polysilicon layers are formed on the oxide layer.

In some examples, the first and second parasitic capacitors correspond to decoupling capacitors that mitigate a dynamic IR drop and a supply noise associated with the integrated circuit.

In yet another embodiment of the present disclosure, an integrated two-grid cell is disclosed. The integrated two-grid cell includes first and second polysilicon layers that are formed parallel to each other, and first through fourth metal-0 oxide diffusion (M0OD) layers. The first and third M0OD layers are formed parallel to first portions of the first and second polysilicon layers on first sides of the first and second polysilicon layers, respectively, and the second M0OD layer is formed parallelly between the first portions of the first and second polysilicon layers on second sides of the first and second polysilicon layers. The first and second sides of the first and second polysilicon layers are opposite sides. Further, the fourth M0OD layer is formed parallelly between second portions of the first and second polysilicon layers on the second sides of the first and second polysilicon layers such that the second and fourth M0OD layers are aligned with each other. The integrated two-grid cell further includes a metal-0 polysilicon (M0PO) layer that is formed on the fourth M0OD layer and the first and second polysilicon layers to form an electrical contact between the fourth M0OD layer and the first and second polysilicon layers. The first through third M0OD layers are coupled with a first supply rail, and the fourth M0OD layer is coupled with a second supply rail. As a result, a first parasitic capacitor is formed between the first M0OD layer and the first polysilicon layer, a second parasitic capacitor is formed between the second M0OD layer and the first polysilicon layer, a third parasitic capacitor is formed between the second M0OD layer and the second polysilicon layer, and a fourth parasitic capacitor is formed between the third M0OD layer and the second polysilicon layer.

In some examples, the integrated two-grid cell further includes first through fourth vias formed on the first through fourth M0OD layers, respectively. The first through third M0OD layers are coupled with the first supply rail by way of the first through third vias, respectively, and the fourth M0OD layer is coupled with the second supply rail by way of the fourth via. An electrical contact is formed between the first through third M0OD layers and the first supply rail by way of the first through third vias, respectively, and an electrical contact is formed between the fourth M0OD layer and the second supply rail by way of the fourth via.

In some examples, the integrated two-grid cell further includes fifth and sixth M0OD layers that are formed parallel to the second portions of the first and second polysilicon layers on the first sides of the first and second polysilicon layers, respectively, such that the first and fifth M0OD layers are aligned with each other, and the third and sixth M0OD layers are aligned with each other.

In some examples, the integrated two-grid cell further includes fifth and sixth vias formed on the fifth and sixth M0OD layers, respectively. The fifth and sixth M0OD layers are coupled with the second supply rail by way of the fifth and sixth vias, respectively. An electrical contact is formed between the fifth and sixth M0OD layers and the second supply rail by way of the fifth and sixth vias, respectively.

In some examples, the integrated two-grid cell further includes third and fourth polysilicon layers that are formed parallel to the first and second polysilicon layers such that the first and fifth M0OD layers are formed between the first and third M0OD layers, and the third and sixth M0OD layers are formed between the second and fourth polysilicon layers.

In some examples, the integrated two-grid cell is on an integrated circuit, and a distance between the third and fourth polysilicon layers is equal to two grids of the integrated circuit.

In some examples, the integrated two-grid cell further includes a substrate, and an oxide layer that is formed on the substrate. The first through sixth M0OD layers and the first through fourth polysilicon layers are formed on the oxide layer.

In some examples, the first through fourth parasitic capacitors correspond to decoupling capacitors that mitigate a dynamic IR drop and a supply noise associated with the integrated circuit.

In some examples, the integrated two-grid cell further includes a seventh via formed on the second M0OD layer, and a metal-1 layer formed on the seventh via to form an electrical contact with the second M0OD layer. The metal-1 layer is formed such that the metal-1 layer extends over third portions of the first and second polysilicon layers, an entirety of the M0PO layer, and portions of the second and fourth M0OD layers.

In some examples, the electrical contact between the metal-1 layer and the second M0OD layer results in formation of a fifth parasitic capacitor between the fifth M0OD layer and the metal-1 layer, and a sixth parasitic capacitor between the sixth M0OD layer and the metal-1 layer.

In some examples, the fifth and sixth parasitic capacitors correspond to decoupling capacitors that further mitigate the dynamic IR drop and the supply noise associated with the integrated circuit.

Various embodiments of the present disclosure disclose an integrated grid cell on an integrated circuit (IC). The integrated grid cell corresponds to at least one of an integrated one-grid cell and an integrated two-grid cell. The integrated grid cell includes various polysilicon layers, metal-0 oxide diffusion (M0OD) layers, and a metal-0 polysilicon (M0PO) layer. The polysilicon layers, the M0OD layers, and the M0PO layer are formed such that potential differences are created between one or more polysilicon layers and one or more M0OD layers. Such potential differences lead to formation of various parasitic capacitors between the one or more polysilicon layers and the one or more M0OD layers. The parasitic capacitors correspond to decoupling capacitors that mitigate a dynamic IR drop and a supply noise associated with the IC.

A structure of the integrated grid cell of the present disclosure is sans source and drain terminals and a channel formed therebetween (i.e., does not correspond to a metal-oxide-semiconductor (MOS) structure). The absence of the source and drain terminals and the channel results in the integrated grid cell of the present disclosure having a size (i.e., a width) of one and two grids (i.e., a size that is smaller than a MOS decap cell). Thus, the integrated grid cell of the present disclosure may be placed in one-grid and two-grid gaps in an IC layout. Further, such an integrated grid cell includes various parasitic capacitors functioning as decoupling capacitors that mitigate the dynamic IR drop and the supply noise associated with the IC. Thus, the dynamic IR drop and the supply noise associated with the IC including the integrated grid cell of the present disclosure is significantly less than that associated with an IC including MOS decap cells and filler cells. Further, as the integrated grid cell includes the parasitic capacitors functioning as decoupling capacitors, the integrated grid cell of the present disclosure may be abutted with functional cells operating at high toggling frequencies (e.g., frequencies greater than 1 gigahertz) for mitigating the dynamic IR drop and the supply noise associated therewith. In such a scenario, the one-grid and two-grid sizes of the integrated grid cell of the present disclosure ensures that a size and a manufacturing cost of the IC are significantly less than that of the IC where MOS decap cells of sizes greater than two grids are abutted to functional cells operating at high toggling frequencies for mitigating the dynamic IR drop and the supply noise associated therewith. Thus, the IC including the integrated grid cell of the present disclosure is more efficient as compared to the IC including the MOS decap cells and the filler cells.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

FIG. 5 represents a flowchart that illustrates a method for forming the first integrated two-grid cell in accordance with an embodiment of the present disclosure.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
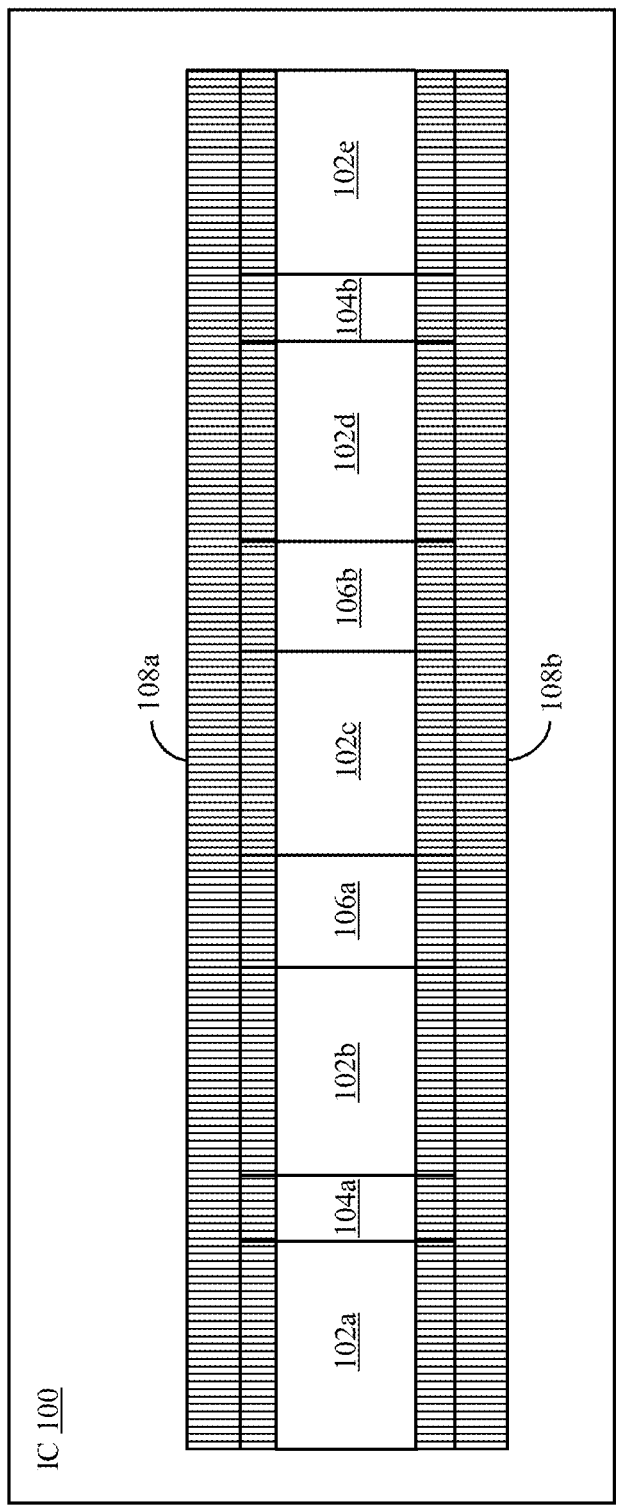
FIG. 1 illustrates a layout of an integrated circuit (IC) in accordance with an embodiment of the present disclosure.

FIG. 1 illustrates a layout of an integrated circuit (IC) 100 in accordance with an embodiment of the present disclosure. The IC 100 includes a plurality of functional cells, of which first through fifth functional cells 102a-102e are shown. The IC 100 further includes a plurality of integrated one-grid cells of which first and second integrated one-grid cells 104a and 104b are shown, a plurality of integrated two-grid cells of which first and second integrated two-grid cells 106a and 106b are shown, and first and second supply rails 108a and 108b. The IC 100 may be included in various devices such as automotive devices, network devices, or the like. It will be apparent to a person skilled in the art that the layout of the IC 100 illustrated in FIG. 1 is to make the illustrations concise and clear, and should not be considered as a limitation of the present disclosure.

The first through fifth functional cells 102a-102e may correspond to a group of transistors (not shown) and interconnects (not shown) that provide a Boolean logic function, a storage function, or the like. Examples of the first through fifth functional cells 102a-102e may include NAND gates, NOR gates, 2-bit adders, multiplexers, flip-flops, or the like.

The first through fifth functional cells 102a-102e are coupled between the first and second supply rails 108a and 108b. Further, the first through fifth functional cells 102a-102e are placed at predetermined distances (i.e., lateral distances) from each other on the IC 100 in accordance with design rules of a layout design. For the sake of ongoing discussion, it is assumed that a distance between the first and second functional cells 102a and 102b is equal to one grid of the IC 100, and a distance between the second and third functional cells 102b and 102c is equal to two grids of the IC 100. Similarly, a distance between the third and fourth functional cells 102c and 102d is equal to two grids of the IC 100, and a distance between the fourth and fifth functional cells 102d and 102e is equal to one grid of the IC 100.

A grid is a unit of measurement in the layout design, and corresponds to lateral distance (i.e., a width) between one or more cells in a layout (such as the layout of the IC 100). In an example, one grid of the IC 100 corresponds to a distance of 0.48 micrometers (μm). Further, the lengths of the first through fifth functional cells 102a-102e are equal.

The plurality of integrated one-grid cells and the plurality of integrated two-grid cells are utilized for mitigating a dynamic IR drop and a supply noise associated with the IC 100, and for providing continuity (i.e., N-well continuity) between the plurality of functional cells. The dynamic IR drop corresponds to a voltage drop across the plurality of functional cells as a result of switching activity of the transistors included in the plurality of functional cells, whereas the supply noise corresponds to a noise introduced as a result of irregularities in a power supply (not shown) associated with the IC 100.

The first integrated one-grid cell 104a is coupled between the first and second supply rails 108a and 108b. Further, a size (i.e., a width) of the first integrated one-grid cell 104a is equal to one grid. Hence, the first integrated one-grid cell 104a is placed in a gap between the first and second functional cells 102a and 102b. Further, the first integrated one-grid cell 104a is placed such that the first integrated one-grid cell 104a is abutted to the first and second functional cells 102a and 102b without violating design rules checks (DRC). The first integrated one-grid cell 104a includes various parasitic capacitors (shown later in FIGS. 2A and 2B) that correspond to decoupling capacitors (i.e., function as decoupling capacitors). Thus, the first integrated one-grid cell 104a mitigates a dynamic IR drop and a supply noise associated with each of the first and second functional cells 102a and 102b, and provides continuity between the first and second functional cells 102a and 102b. The structure of the first integrated one-grid cell 104a is explained in conjunction with FIGS. 2A and 2B.

The second integrated one-grid cell 104b is coupled between the first and second supply rails 108a and 108b. Further, a size (i.e., a width) of the second integrated one-grid cell 104b is equal to one grid. Hence, the second integrated one-grid cell 104b is placed in a gap between the fourth and fifth functional cells 102d and 102e. Further, the second integrated one-grid cell 104b is placed such that the second integrated one-grid cell 104b is abutted to the fourth and fifth functional cells 102d and 102e without violating DRC. The second integrated one-grid cell 104b includes various parasitic capacitors (not shown) that correspond to decoupling capacitors (i.e., function as decoupling capacitors). Thus, the second integrated one-grid cell 104b mitigates a dynamic IR drop and a supply noise associated with each of the fourth and fifth functional cells 102d and 102e, and provides continuity between the fourth and fifth functional cells 102d and 102e. The structure of the second integrated one-grid cell 104b is same as that of the first integrated one-grid cell 104a. The first and second integrated one-grid cells 104a and 104b are operable across voltage-temperature (VT) profiles.

The first integrated two-grid cell 106a is coupled between the first and second supply rails 108a and 108b. Further, a size (i.e., a width) of the first integrated two-grid cell 106a is equal to two grids. Hence, the first integrated two-grid cell 106a is placed in a gap between the second and third functional cells 102b and 102c. Further, the first integrated two-grid cell 106a is placed such that the first integrated two-grid cell 106a is abutted to the second and third functional cells 102b and 102c without violating DRC. The first integrated two-grid cell 106a includes various parasitic capacitors (shown later in FIGS. 3A and 3B) that correspond to decoupling capacitors (i.e., function as decoupling capacitors). Thus, the first integrated two-grid cell 106a mitigates a dynamic IR drop and a supply noise associated with the each of the second and third functional cells 102b and 102c, and provides continuity between the second and third functional cells 102b and 102c. The structure of the first integrated two-grid cell 106a is explained in conjunction with FIGS. 3A and 3B.

The second integrated two-grid cell 106b is coupled between the first and second supply rails 108a and 108b. Further, a size (i.e., a width) of the second integrated two-grid cell 106b is equal to two grids. Hence, the second integrated two-grid cell 106b is placed in a gap between the third and fourth functional cells 102c and 102d. Further, the second integrated two-grid cell 106b is placed such that the second integrated two-grid cell 106b is abutted to the third and fourth functional cells 102c and 102d without violating DRC. The second integrated two-grid cell 106b includes various parasitic capacitors (not shown) that correspond to decoupling capacitors (i.e., function as decoupling capacitors). Thus, the second integrated two-grid cell 106b mitigates a dynamic IR drop and a supply noise associated with each of the third and fourth functional cells 102c and 102d, and provides continuity between the third and fourth functional cells 102c and 102d. The structure of the second integrated two-grid cell 106b is same as that of the first integrated two-grid cell 106a. The first and second integrated two-grid cells 106a and 106b are operable across the VT profiles.

The first and second supply rails 108a and 108b are made up of a metallized layer (such as a metal-1 layer). In an embodiment, the first supply rail 108a is coupled with ground, and the second supply rail 108b is coupled with the power supply, and configured to receive a supply voltage (not shown), and provide the supply voltage to the first through fifth functional cells 102a-102e, the first and second integrated one-grid cells 104a and 104b, and the first and second integrated two-grid cells 106a and 106b. In another embodiment, the second supply rail 108b is coupled with ground, and the first supply rail 108a is coupled with the power supply, and configured to receive the supply voltage, and provide the supply voltage to the first through fifth functional cells 102a-102e, the first and second integrated one-grid cells 104a and 104b, and the first and second integrated two-grid cells 106a and 106b.

It will be apparent to a person skilled in the art that although FIG. 1 describes that the plurality of functional cells are placed at predetermined distances of one grid and two grids from each other, the scope of the present disclosure is not limited to it. In various other embodiments, the plurality of functional cells may be placed from each other at predetermined distances that are greater than two grids, without deviating from the scope of the present disclosure. In such a scenario, metal-oxide-semiconductor (MOS) decap cells or integrated grid cells having sizes of three grids or more may be placed between such functional cells. The integrated grid cells having sizes of three grids or more are formed by utilizing various integrated one-grid cells (such as the first and second integrated one-grid cells 104a and 104b) and integrated two-grid cells (such as the first and second integrated two-grid cells 106a and 106b).

Figure 2A:
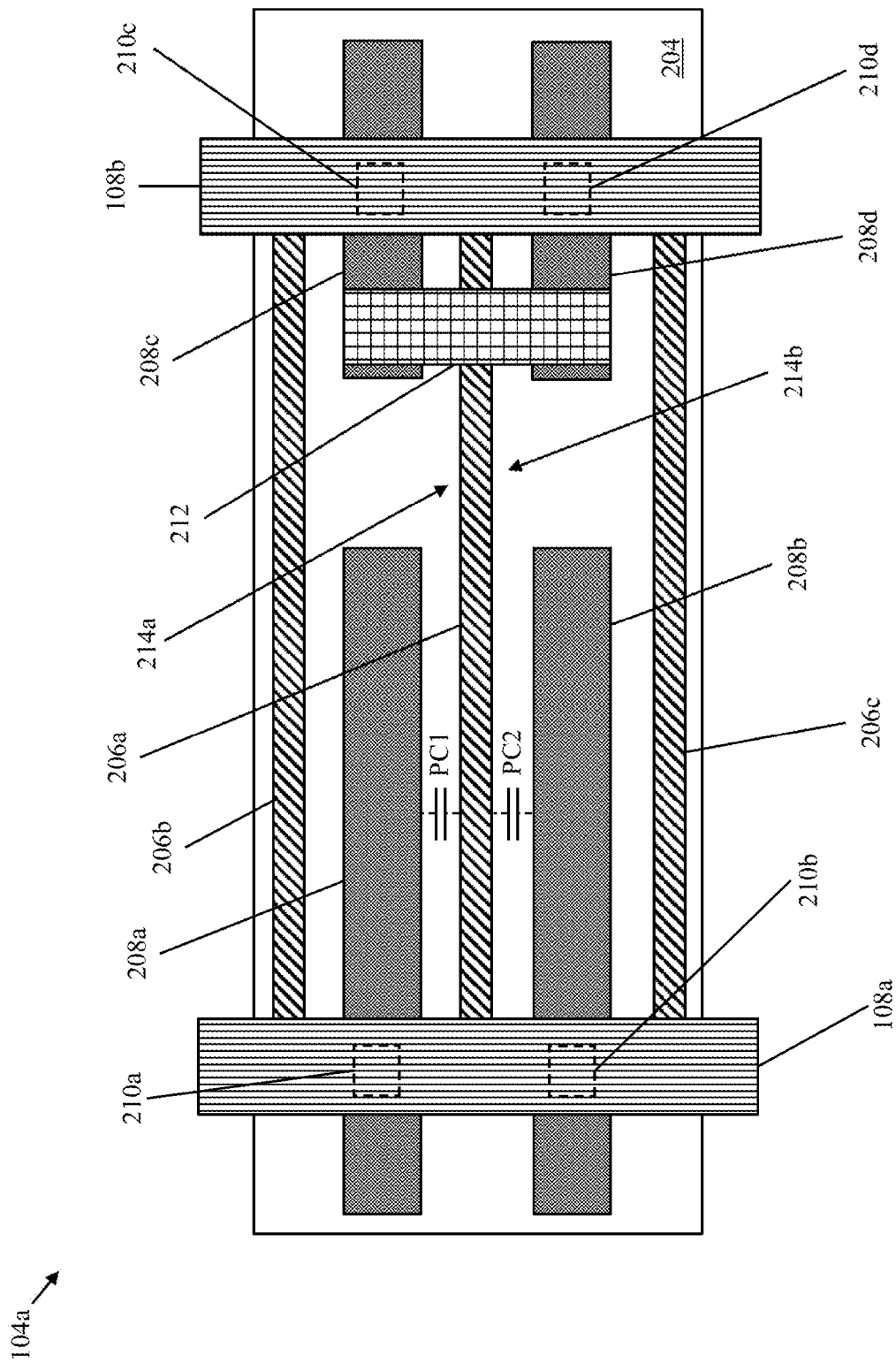
FIGS. 2A and 2B illustrate a top view and an isometric view of a layout of a first integrated one-grid cell of the IC of FIG. 1, respectively, in accordance with an embodiment of the present disclosure.
Figure 2B:
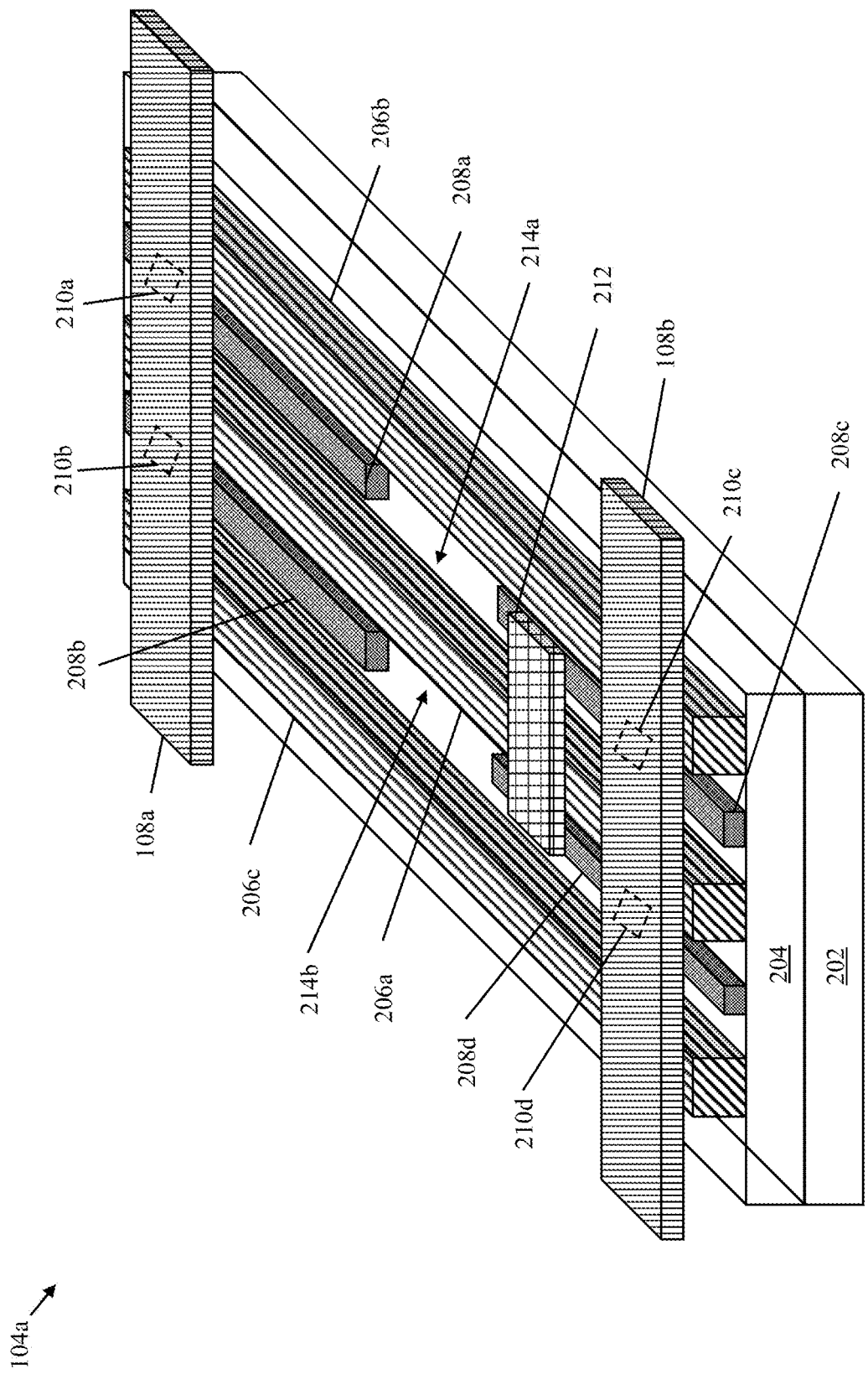

FIGS. 2A and 2B illustrate a top view and an isometric view of a layout of the first integrated one-grid cell 104a, respectively, in accordance with an embodiment of the present disclosure. The first integrated one-grid cell 104a is on the IC 100, and is abutted between the first and second functional cells 102a and 102b. Further, a width of the first integrated one-grid cell 104a is equal to one grid of the IC 100 (e.g., 0.48 μm), whereas a length the first integrated one-grid cell 104a is equal to the lengths of the first and second functional cells 102a and 102b. The first integrated one-grid cell 104a includes a first substrate 202, a first oxide layer 204, first through third polysilicon layers 206a-206c, first through fourth metal-0 oxide diffusion (M0OD) layers 208a-208d, first through fourth vias 210a-210d, and a first metal-0 polysilicon (M0PO) layer 212.

The first substrate 202 corresponds to a surface upon which semiconductor structures, such as the first integrated one-grid cell 104a, are formed. The first substrate 202 may include indium phosphide (InP), gallium arsenide (GaAs), silicon, silica-on-silicon, silica, silica-on-polymer, glass, ceramic, polymer, or a combination thereof. The first oxide layer 204 is formed on the first substrate 202. In one example, the first oxide layer 204 is formed on the first substrate 202 such that the first oxide layer 204 covers the first substrate 202 in entirety.

The first through third polysilicon layers 206a-206c are formed on the first oxide layer 204. Further, the first through third polysilicon layers 206a-206c are formed parallel to each other. In other words, the second and third polysilicon layers 206b and 206c are formed parallel to the first polysilicon layer 206a such that the second polysilicon layer 206b is formed on a first side 214a of the first polysilicon layer 206a, and the third polysilicon layer 206c is formed on a second side 214b of the first polysilicon layer 206a. The first and second sides 214a and 214b are opposite sides of the first polysilicon layer 206a. The first polysilicon layer 206a facilitates mitigation of the dynamic IR drop and the supply noise associated with the IC 100 (i.e., associated with each of the first and second functional cells 102a and 102b). Further, the second and third polysilicon layers 206b and 206c correspond to boundaries of the first integrated one-grid cell 104a, and facilitate abutment of the first integrated one-grid cell 104a to the second and first functional cells 102b and 102a, respectively. In an embodiment, the first integrated one-grid cell 104a is abutted with the first and second functional cells 102a and 102b such that the second polysilicon layer 206b overlaps with the second functional cell 102b, and the third polysilicon layer 206c overlaps with the first functional cell 102a. A distance between the second and third polysilicon layers 206b and 206c corresponds to the width of the first integrated one-grid cell 104a, and is equal to one grid of the IC 100.

The first through fourth M0OD layers 208a-208d are formed on the first oxide layer 204 such that the first and third M0OD layers 208a and 208c are aligned with each other, and the second and fourth M0OD layers 208b and 208d are aligned with each other. The first through fourth M0OD layers 208a-208d facilitate mitigation of the dynamic IR drop and the supply noise associated with the IC 100 (i.e., associated with each of the first and second functional cells 102a and 102b). The first and second M0OD layers 208a and 208b are formed parallel to a first portion of the first polysilicon layer 206a on the first and second sides 214a and 214b of the first polysilicon layer 206a, respectively. Similarly, the third and fourth M0OD layers 208c and 208d are formed parallel to a second portion of the first polysilicon layer 206a on the first and second sides 214a and 214b of the first polysilicon layer 206a, respectively. Further, the first and third M0OD layers 208a and 208c are formed between the first and second polysilicon layers 206a and 206b, whereas the second and fourth M0OD layers 208b and 208d are formed between the first and third polysilicon layers 206a and 206c.

The first and second M0OD layers 208a and 208b are coupled with the first supply rail 108a to form an electrical contact with the first supply rail 108a. Similarly, the third and fourth M0OD layers 208c and 208d are coupled with the second supply rail 108b to form an electrical contact with the second supply rail 108b.

The first through fourth vias 210a-210d facilitate the formation of the electrical contact between the first and second supply rails 108a and 108b and the first through fourth M0OD layers 208a-208d. In an example, the first through fourth vias 210a-210d correspond to a via-O layer.

The first via 210a is formed on the first M0OD layer 208a, and the first M0OD layer 208a is coupled with the first supply rail 108a by way of the first via 210a. Thus, the electrical contact is formed between the first M0OD layer 208a and the first supply rail 108a by way of the first via 210a. Similarly, the second via 210b is formed on the second M0OD layer 208b, and the second M0OD layer 208b is coupled with the first supply rail 108a by way of the second via 210b. Thus, the electrical contact is formed between the second M0OD layer 208b and the first supply rail 108a by way of the second via 210b. Further, the third via 210c is formed on the third M0OD layer 208c, and the third M0OD layer 208c is coupled with the second supply rail 108b by way of the third via 210c. Thus, the electrical contact is formed between the third M0OD layer 208c and the second supply rail 108b by way of the third via 210c. Similarly, the fourth via 210d is formed on the fourth M0OD layer 208d, and the fourth M0OD layer 208d is coupled with the second supply rail 108b by way of the fourth via 210d. Thus, the electrical contact is formed between the fourth M0OD layer 208d and the second supply rail 108b by way of the fourth via 210d.

The first M0PO layer 212 corresponds to a metallized layer, and is formed on the third and fourth M0OD layers 208c and 208d and the first polysilicon layer 206a to form an electrical contact between the third and fourth M0OD layers 208c and 208d and the first polysilicon layer 206a. As the third and fourth M0OD layers 208c and 208d are coupled with the second supply rail 108b, an electrical contact is formed between the first polysilicon layer 206a and the second supply rail 108b. In other words, the first polysilicon layer 206a is coupled with the second supply rail 108b by way of the third and fourth M0OD layers 208c and 208d. Thus, the first polysilicon layer 206a is at a potential level that is equal to a potential level of the second supply rail 108b. Further, as described above, the first and second M0OD layers 208a and 208b are coupled with the first supply rail 108a (i.e., the first and second M0OD layers 208a and 208b are at a potential level that is equal to a potential level of the first supply rail 108a). Hence, potential differences are created between the first M0OD layer 208a and the first polysilicon layer 206a (i.e., the first portion of the first polysilicon layer 206a), and between the second M0OD layer 208b and the first polysilicon layer 206a (i.e., the first portion of the first polysilicon layer 206a).

When two conductors (i.e., layers), that are in a vicinity of each other, have different potential levels, a parasitic capacitor is formed between such conductors (i.e., layers). Thus, the potential difference between the first M0OD layer 208a and the first polysilicon layer 206a results in formation of a first parasitic capacitor PC1 between the first M0OD layer 208a and the first polysilicon layer 206a. Similarly, the potential difference between the second M0OD layer 208b and the first polysilicon layer 206a results in formation of a second parasitic capacitor PC2 between the second M0OD layer 208b and the first polysilicon layer 206a. The first and second parasitic capacitors PC1 and PC2 correspond to decoupling capacitors that mitigate the dynamic IR drop and the supply noise associated with the IC 100 (i.e., associated with each of the first and second functional cells 102a and 102b).

The first integrated one-grid cell 104a thus, in addition to providing continuity between the first and second functional cells 102a and 102b, mitigates the dynamic IR drop and the supply noise associated with each of the first and second functional cells 102a and 102b. It will be apparent to a person skilled in the art that the second integrated one-grid cell 104b mitigates the dynamic IR drop and the supply noise associated with each of the fourth and fifth functional cells 102d and 102e in a similar manner as described above.

Figure 3A:
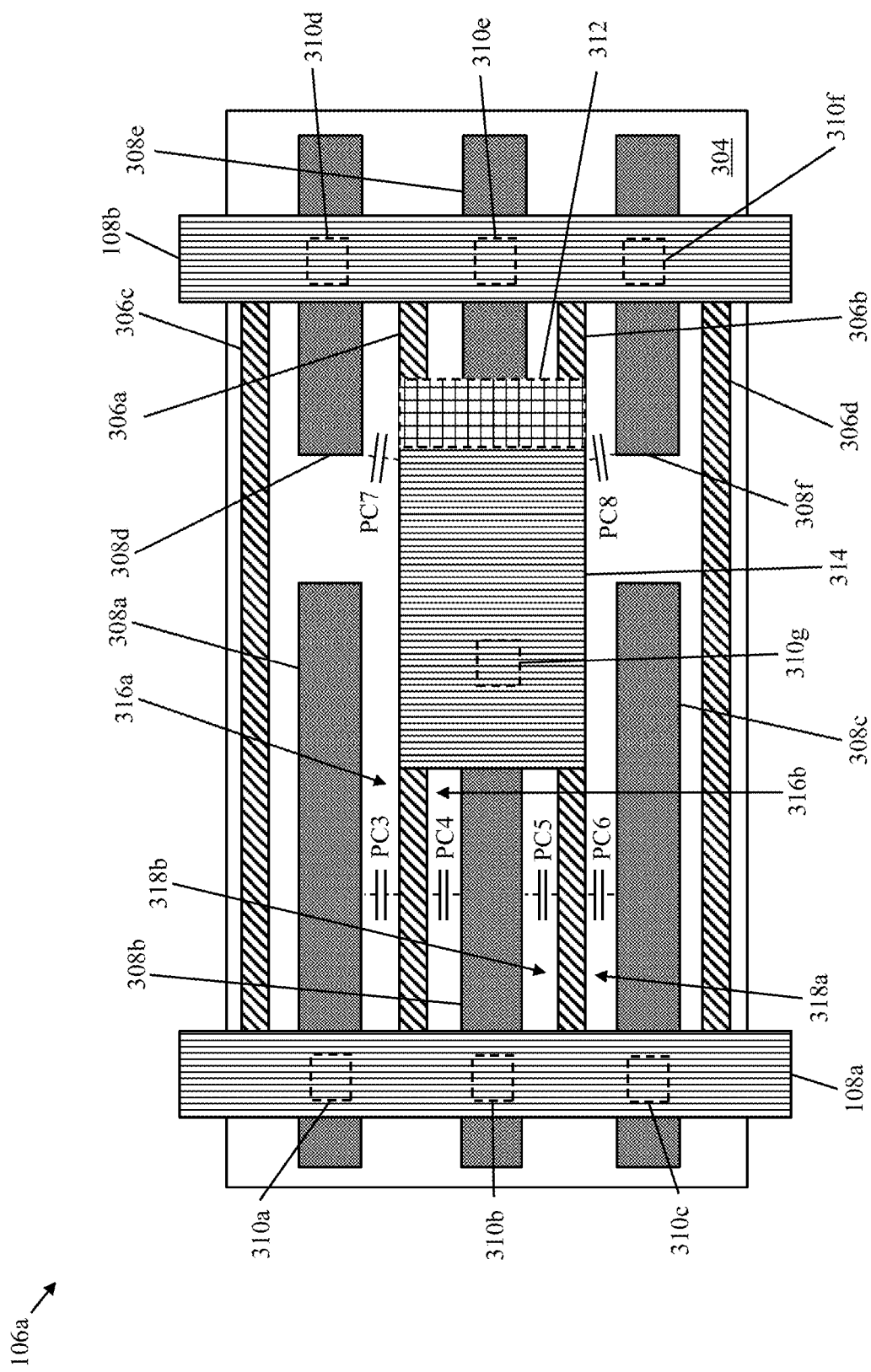
FIGS. 3A and 3B illustrate a top view and an isometric view of a layout of a first integrated two-grid cell of the IC of FIG. 1, respectively, in accordance with an embodiment of the present disclosure.
Figure 3B:
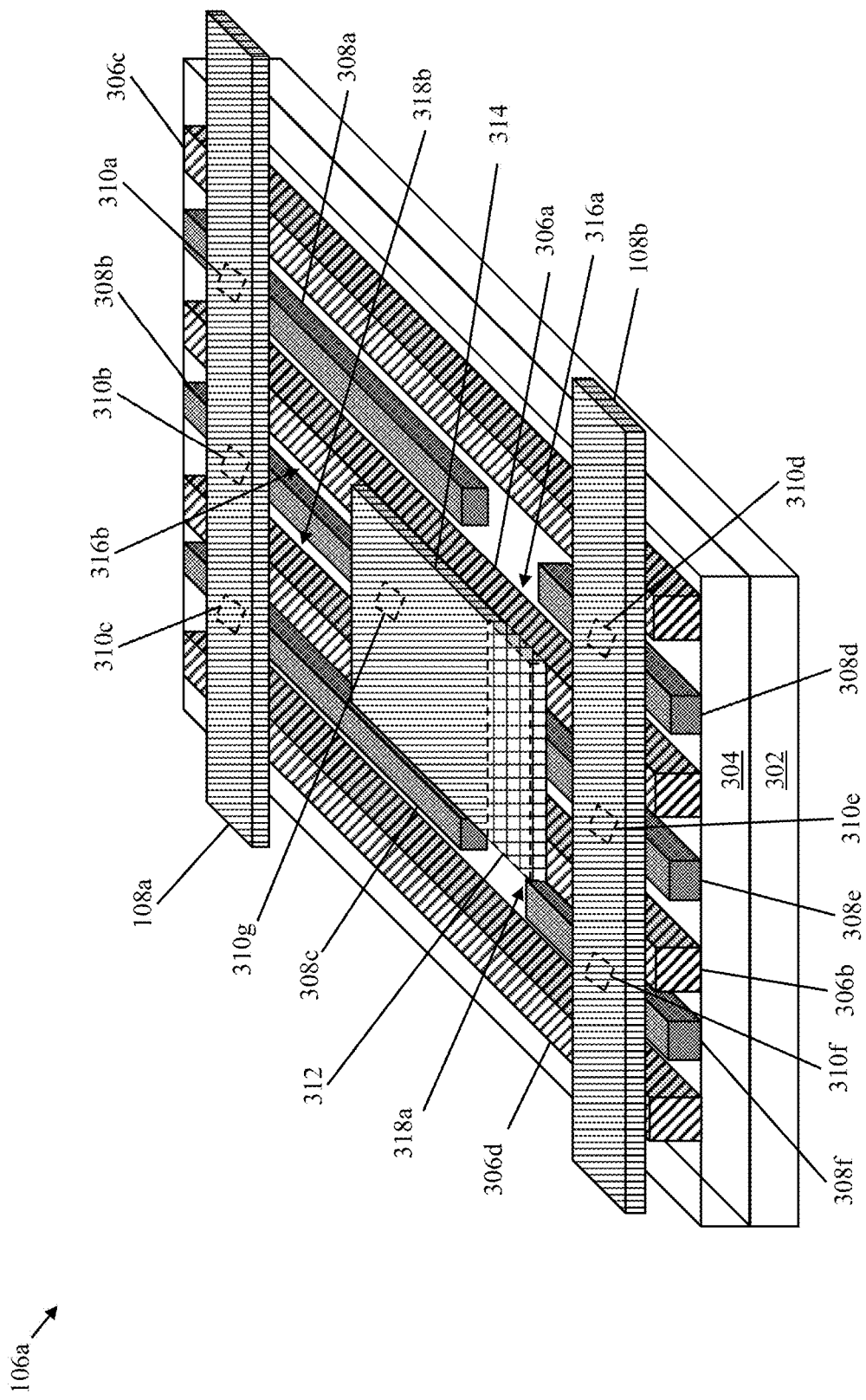

FIGS. 3A and 3B illustrate a top view and an isometric view of a layout of the first integrated two-grid cell 106a, respectively, in accordance with an embodiment of the present disclosure. The first integrated two-grid cell 106a is on the IC 100, and is abutted between the second and third functional cells 102b and 102c. Further, a width of the first integrated two-grid cell 106a is equal to two grids of the IC 100 (e.g., 0.48 μm*2=0.96 μm), whereas a length the first integrated two-grid cell 106a is equal to the lengths of the second and third functional cells 102b and 102c. The first integrated two-grid cell 106a includes a second substrate 302, a second oxide layer 304, fourth through seventh polysilicon layers 306a-306d, fifth through tenth M0OD layers 308a-308f, fifth through eleventh vias 310a-310g, a second M0PO layer 312, and a metal-1 layer 314.

The second substrate 302 corresponds to a surface upon which semiconductor structures, such as the first integrated two-grid cell 106a, are formed. The second substrate 302 may include InP, GaAs, silicon, silica-on-silicon, silica, silica-on-polymer, glass, ceramic, polymer, or a combination thereof. The second oxide layer 304 is formed on the second substrate 302. In one example, the second oxide layer 304 is formed on the second substrate 302 such that the second oxide layer 304 covers the second substrate 302 in entirety.

The fourth and fifth polysilicon layers 306a and 306b are formed on the second oxide layer 304. The fourth and fifth polysilicon layers 306a and 306b are formed parallel to each other, and facilitate mitigation of the dynamic IR drop and the supply noise associated with the IC 100 (i.e., associated with each of the second and third functional cells 102b and 102c). The sixth and seventh polysilicon layers 306c and 306d are formed parallel to the fourth and fifth polysilicon layers 306a and 306b such that the sixth polysilicon layer 306c is formed on a first side 316a of the fourth polysilicon layer 306a, and the seventh polysilicon layer 306d is formed on a first side 318a of the fifth polysilicon layer 306b. The sixth and seventh polysilicon layers 306c and 306d correspond to boundaries of the first integrated two-grid cell 106a, and facilitate abutment of the first integrated two-grid cell 106a to the third and second functional cells 102c and 102b, respectively. In an embodiment, the first integrated two-grid cell 106a is abutted with the second and third functional cells 102b and 102c such that the sixth polysilicon layer 306c overlaps with the third functional cell 102c, and the seventh polysilicon layer 306d overlaps with the second functional cell 102b. A distance between the sixth and seventh polysilicon layers 306c and 306d corresponds to a width of the first integrated two-grid cell 106a, and is equal to two grids of the IC 100.

The fifth through tenth M0OD layers 308a-308f are formed on the second oxide layer 304 such that the fifth and eighth M0OD layers 308a and 308d are aligned with each other, the sixth and ninth M0OD layers 308b and 308e are aligned with each other, and the seventh and tenth M0OD layers 308c and 308f are aligned with each other. The fifth through tenth M0OD layers 308a-308f facilitate mitigation of the dynamic IR drop and the supply noise associated with the IC 100 (i.e., associated with each of the second and third functional cells 102b and 102c).

The fifth and eighth M0OD layers 308a and 308d are parallely formed between the fourth and sixth polysilicon layers 306a and 306c, whereas the sixth and ninth M0OD layers 308b and 308e are parallely formed between the fourth and fifth polysilicon layers 306a and 306b. Similarly, the seventh and tenth M0OD layers 308c and 308f are parallely formed between the fifth and seventh polysilicon layers 306b and 306d.

The fifth and eighth M0OD layers 308a and 308d are formed parallel to first and second portions of the fourth polysilicon layer 306a on the first side 316a of the fourth polysilicon layer 306a, respectively. Similarly, the seventh and tenth M0OD layers 308c and 308f are formed parallel to first and second portions of the fifth polysilicon layer 306b on the first side 318a of the fifth polysilicon layer 306b, respectively. The sixth M0OD layer 308b is formed parallelly between the first portions of the fourth and fifth polysilicon layers 306a and 306b on second sides 316b and 318b of the fourth and fifth polysilicon layers 306a and 306b, respectively. Similarly, the ninth M0OD layer 308e is formed parallelly between the second portions of the fourth and fifth polysilicon layers 306a and 306b on the second sides 316b and 318b of the fourth and fifth polysilicon layers 306a and 306b, respectively, such that the sixth and ninth M0OD layers 308b and 308e are aligned with each other. The first and second sides 316a and 316b of the fourth polysilicon layer 306a are opposite sides of the fourth polysilicon layer 306a, and the first and second sides 318a and 318b of the fifth polysilicon layer 306b are opposite sides of the fifth polysilicon layer 306b.

The fifth through seventh M0OD layers 308a-308c are coupled with the first supply rail 108a to form an electrical contact with the first supply rail 108a. Similarly, the eighth through tenth M0OD layers 308d-308f are coupled with the second supply rail 108b to form an electrical contact with the second supply rail 108b.

The fifth through tenth vias 310a-310f facilitate the formation of the electrical contact between the first and second supply rails 108a and 108b and the fifth through tenth M0OD layers 308a-308f. The fifth through tenth vias 310a-310f correspond to a via-O layer.

The fifth via 310a is formed on the fifth M0OD layer 308a, and the fifth M0OD layer 308a is coupled with the first supply rail 108a by way of the fifth via 310a. Thus, the electrical contact is formed between the fifth M0OD layer 308a and the first supply rail 108a by way of the fifth via 310a. Similarly, the sixth and seventh vias 310b and 310c are formed on the sixth and seventh M0OD layers 308b and 308c, respectively, and the sixth and seventh M0OD layers 308b and 308c are coupled with the first supply rail 108a by way of the sixth and seventh vias 310b and 310c, respectively. Thus, the electrical contact is formed between the sixth and seventh M0OD layers 308b and 308c and the first supply rail 108a by way of the sixth and seventh vias 310b and 310c, respectively.

The eighth via 310d is formed on the eighth M0OD layer 308d, and the eighth M0OD layer 308d is coupled with the second supply rail 108b by way of the eighth via 310d. Thus, the electrical contact is formed between the eighth M0OD layer 308d and the second supply rail 108b by way of the eighth via 310d. Similarly, the ninth and tenth vias 310e and 310f are formed on the ninth and tenth M0OD layers 308e and 308f, respectively, and the ninth and tenth M0OD layers 308e and 308f are coupled with the second supply rail 108b by way of the ninth and tenth vias 310e and 310f, respectively. Thus, the electrical contact is formed between the ninth and tenth M0OD layers 308e and 308f and the second supply rail 108b by way of the ninth and tenth vias 310e and 310f, respectively.

The second M0PO layer 312 corresponds to a metallized layer, and is formed on the ninth M0OD layer 308e and the fourth and fifth polysilicon layers 306a and 306b to form an electrical contact between the ninth M0OD layer 308e and the fourth and fifth polysilicon layers 306a and 306b. As the ninth M0OD layer 308e is coupled with the second supply rail 108b, an electrical contact is formed between the fourth and fifth polysilicon layers 306a and 306b and the second supply rail 108b. In other words, the fourth and fifth polysilicon layers 306a and 306b are coupled with the second supply rail 108b by way of the ninth M0OD layer 308e. Thus, the fourth and fifth polysilicon layers 306a and 306b are at a potential level that is equal to the potential level of the second supply rail 108b. Further, as described above, the fifth through seventh M0OD layers 308a-308c are coupled with the first supply rail 108a (i.e., the fifth through seventh M0OD layers 308a-308c are at a potential level that is equal to the potential level of the first supply rail 108a). Hence, potential differences are created between the fifth M0OD layer 308a and the fourth polysilicon layer 306a (i.e., the first portion of the fourth polysilicon layer 306a), and between the sixth M0OD layer 308b and the fourth polysilicon layer 306a (i.e., the first portion of the fourth polysilicon layer 306a). Similarly, potential differences are further created between the sixth M0OD layer 308b and the fifth polysilicon layer 306b (i.e., the first portion of the fifth polysilicon layer 306b), and between the seventh M0OD layer 308c and the fifth polysilicon layer 306b (i.e., the first portion of the fifth polysilicon layer 306b).

When two conductors (i.e., layers), that are in a vicinity of each other, have different potential levels, a parasitic capacitor is formed between such conductors (i.e., layers). Thus, the potential difference between the fifth M0OD layer 308a and the fourth polysilicon layer 306a results in formation of a third parasitic capacitor PC3 between the fifth M0OD layer 308a and the fourth polysilicon layer 306a. Similarly, the potential difference between the sixth M0OD layer 308b and the fourth polysilicon layer 306a results in formation of a fourth parasitic capacitor PC4 between the sixth M0OD layer 308b and the fourth polysilicon layer 306a. Further, the potential difference between the sixth M0OD layer 308b and the fifth polysilicon layer 306b results in formation of a fifth parasitic capacitor PC5 between the sixth M0OD layer 308b and the fifth polysilicon layer 306b. Similarly, the potential difference between the seventh M0OD layer 308c and the fifth polysilicon layer 306b results in formation of a sixth parasitic capacitor PC6 between the seventh M0OD layer 308c and the fifth polysilicon layer 306b. The third through sixth parasitic capacitors PC3-PC6 correspond to decoupling capacitors that mitigate the dynamic IR drop and the supply noise associated with the IC 100 (i.e., associated with each of the second and third functional cells 102b and 102c).

The eleventh via 310g is formed on the sixth M0OD layer 308b. In an example, the sixth and eleventh vias 310b and 310g are formed on opposite ends of the sixth M0OD layer 308b. The eleventh via 3102 corresponds to a via-0 layer.

The metal-1 layer 314 is formed on the eleventh via 310g to form an electrical contact with the sixth M0OD layer 308b. The metal-1 layer 314 is formed such that the metal-1 layer 314 extends over third portions of the fourth and fifth polysilicon layers 306a and 306b, an entirety of the second M0PO layer 312, and portions of the sixth and ninth M0OD layers 308b and 308e. In one example, the third portion of the fourth polysilicon layer 306a overlaps with the first and second portions of the fourth polysilicon layer 306a. Similarly, the third portion of the fifth polysilicon layer 306b overlaps with the first and second portions of the fifth polysilicon layer 306b.

As the sixth M0OD layer 308b is coupled with the first supply rail 108a, an electrical contact is formed between the metal-1 layer 314 and the first supply rail 108a. In other words, the metal-1 layer 314 is coupled with the first supply rail 108a by way of the sixth M0OD layer 308b. Thus, the metal-1 layer 314 is at a potential level that is equal to the potential level of the first supply rail 108a. Further, as described above, the eighth and tenth M0OD layers 308d and 308f are coupled with the second supply rail 108b (i.e., the eighth and tenth M0OD layers 308d and 308f are at a potential level that is equal to the potential level of the second supply rail 108b). Thus, potential differences are created between the eighth M0OD layer 308d and the metal-1 layer 314, and between the tenth M0OD layer 308f and the metal-1 layer 314.

The potential difference between the eighth M0OD layer 308d and the metal-1 layer 314 results in formation of a seventh parasitic capacitor PC7 between the eighth M0OD layer 308d and the metal-1 layer 314. Similarly, the potential difference between the tenth M0OD layer 308f and the metal-1 layer 314 results in formation of an eighth parasitic capacitor PC8 between the tenth M0OD layer 308f and the metal-1 layer 314. In other words, the electrical contact between the metal-1 layer 314 and the sixth M0OD layer 308b results in formation of the seventh parasitic capacitor PC7 between the eighth M0OD layer 308d and the metal-1 layer 314, and the eighth parasitic capacitor PC8 between the tenth M0OD layer 308f and the metal-1 layer 314. The seventh and eighth parasitic capacitors PC7 and PC8 correspond to decoupling capacitors that further mitigate the dynamic IR drop and the supply noise associated with the IC 100 (i.e., associated with each of the second and third functional cells 102b and 102c).

The first integrated two-grid cell 106a thus, in addition to providing continuity between the second and third functional cells 102b and 102c, mitigates the dynamic IR drop and the supply noise associated with each of the second and third functional cells 102b and 102c. It will be apparent to a person skilled in the art that the second integrated two-grid cell 106b mitigates the dynamic IR drop and the supply noise associated with each of the third and fourth functional cells 102c and 102d in a similar manner as described above.

Figure 4:
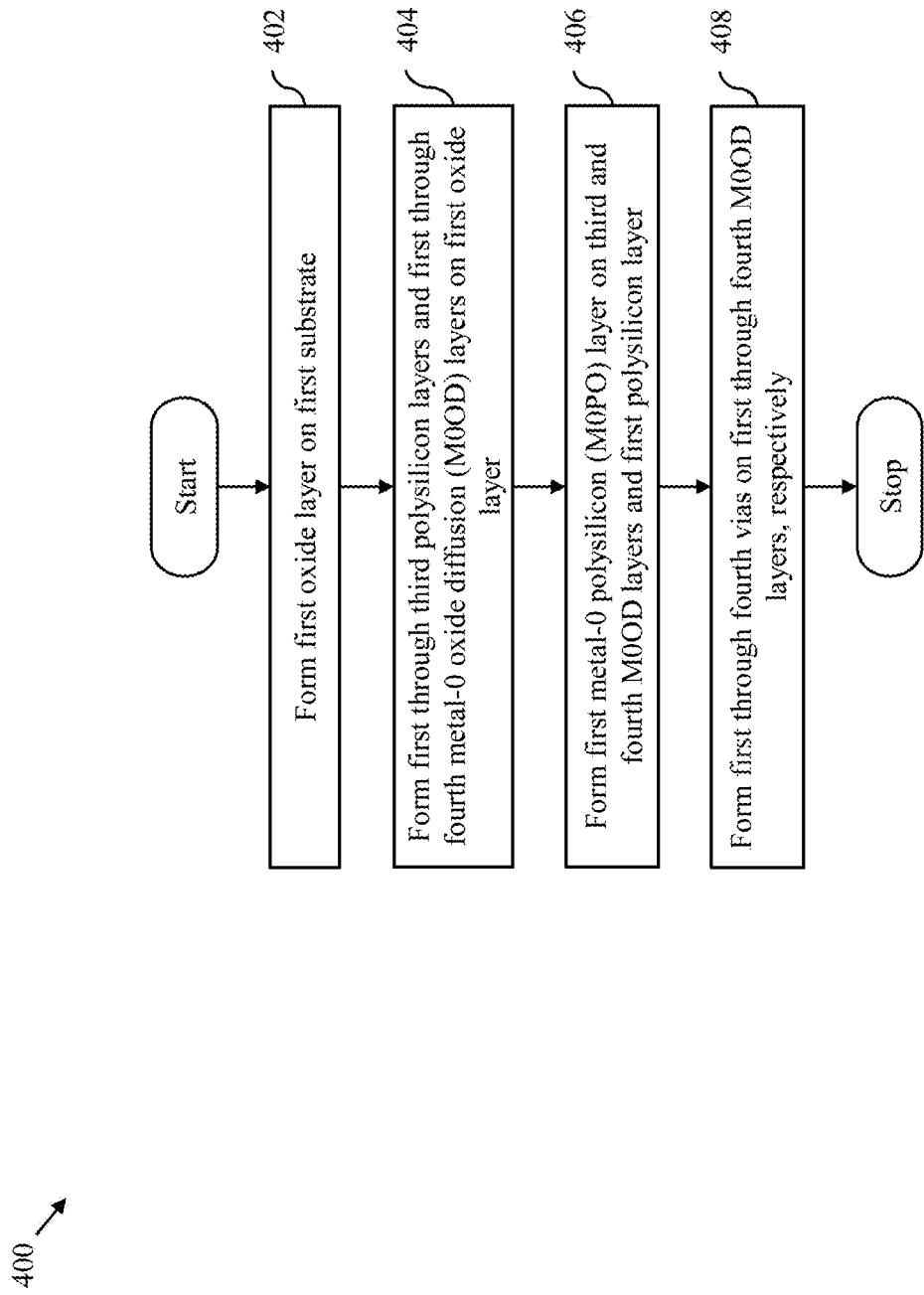
FIG. 4 represents a flowchart that illustrates a method for forming the first integrated one-grid cell in accordance with an embodiment of the present disclosure.

FIG. 4 represents a flowchart 400 that illustrates a method for forming the first integrated one-grid cell 104a in accordance with an embodiment of the present disclosure. The first integrated one-grid cell 104a is abutted between the first and second functional cells 102a and 102b. The first integrated one-grid cell 104a includes the first substrate 202.

At step 402, the first oxide layer 204 is formed on the first substrate 202. At step 404, the first through third polysilicon layers 206a-206c and the first through fourth M0OD layers 208a-208d are formed on the first oxide layer 204.

The first through third polysilicon layers 206a-206c are formed parallel to each other such that the second and third polysilicon layers 206b and 206c are formed on the first and second sides 214a and 214b of the first polysilicon layer 206a, respectively. Further, the first through fourth M0OD layers 208a-208d are formed such that the first and third M0OD layers 208a and 208c are aligned with each other, and the second and fourth M0OD layers 208b and 208d are aligned with each other. The first and second M0OD layers 208a and 208b are formed parallel to the first portion of the first polysilicon layer 206a on the first and second sides 214a and 214b of the first polysilicon layer 206a, respectively. Similarly, the third and fourth M0OD layers 208c and 208d are formed parallel to the second portion of the first polysilicon layer 206a on the first and second sides 214a and 214b of the first polysilicon layer 206a, respectively. Further, the first and third M0OD layers 208a and 208c are formed between the first and second polysilicon layers 206a and 206b, whereas the second and fourth M0OD layers 208b and 208d are formed between the first and third polysilicon layers 206a and 206c.

At step 406, the first M0PO layer 212 is formed on the third and fourth M0OD layers 208c and 208d and the first polysilicon layer 206a to form an electrical contact between the third and fourth M0OD layers 208c and 208d and the first polysilicon layer 206a. At step 408, the first through fourth vias 210a-210d are formed on the first through fourth M0OD layers 208a-208d, respectively. The first and second M0OD layers 208a and 208b are coupled with the first supply rail 108a by way of the first and second vias 210a and 210b, respectively. Thus, the electrical contact is formed between the first and second M0OD layers 208a and 208b and the first supply rail 108a by way of the first and second vias 210a and 210b, respectively. Similarly, the third and fourth M0OD layers 208c and 208d are coupled with the second supply rail 108b by way of the third and fourth vias 210c and 210d, respectively. Thus, the electrical contact is formed between the third and fourth M0OD layers 208c and 208d and the second supply rail 108b by way of the third and fourth vias 210c and 210d, respectively.

The first polysilicon layer 206a is thus at a potential level that is equal to the potential level of the second supply rail 108b, and the first and second M0OD layers 208a and 208b are at a potential level that is equal to the potential level of the first supply rail 108a. As a result, the potential differences are created between the first M0OD layer 208a and the first polysilicon layer 206a, and between the second M0OD layer 208b and the first polysilicon layer 206a.

The potential difference between the first M0OD layer 208a and the first polysilicon layer 206a results in formation of the first parasitic capacitor PC1 therebetween. Similarly, the potential difference between the second M0OD layer 208b and the first polysilicon layer 206a results in formation of the second parasitic capacitor PC2 therebetween. Thus, the first and second parasitic capacitors PC1 and PC2 are formed based on the electrical contact between the third and fourth M0OD layers 208c and 208d and the first polysilicon layer 206a, the electrical contact between the first and second M0OD layers 208a and 208b and the first supply rail 108a, and the electrical contact between the third and fourth M0OD layers 208c and 208d and the second supply rail 108b.

The first and second parasitic capacitors PC1 and PC2 correspond to decoupling capacitors that mitigate the dynamic IR drop and the supply noise associated with the IC 100 (i.e., associated with each of the first and second functional cells 102a and 102b). It will be apparent to a person skilled in the art that the second integrated one-grid cell 104b is formed in a similar manner as described above.

FIG. 5 represents a flowchart 500 that illustrates a method for forming the first integrated two-grid cell 106a in accordance with an embodiment of the present disclosure. The first integrated two-grid cell 106a is abutted between the second and third functional cells 102b and 102c. The first integrated two-grid cell 106a includes the second substrate 302.

At step 502, the second oxide layer 304 is formed on the second substrate 302. At step 504, the fourth through seventh polysilicon layers 306a-306d and the fifth through tenth M0OD layers 308a-308f are formed on the second oxide layer 304.

The fourth and fifth polysilicon layers 306a and 306b are formed parallel to each other. The sixth and seventh polysilicon layers 306c and 306d are formed parallel to the fourth and fifth polysilicon layers 306a and 306b such that the sixth and seventh polysilicon layers 306c and 306d are formed on the first sides 316a and 318a of the fourth and fifth polysilicon layers 306a and 306b, respectively. The fifth through tenth M0OD layers 308a-308f are formed such that the fifth and eighth M0OD layers 308a and 308d are aligned with each other, the sixth and ninth M0OD layers 308b and 308e are aligned with each other, and the seventh and tenth M0OD layers 308c and 308f are aligned with each other. The fifth and eighth M0OD layers 308a and 308d are parallely formed between the fourth and sixth polysilicon layers 306a and 306c, whereas the sixth and ninth M0OD layers 308b and 308e are parallely formed between the fourth and fifth polysilicon layers 306a and 306b. Similarly, the seventh and tenth M0OD layers 308c and 308f are parallely formed between the fifth and seventh polysilicon layers 306b and 306d.

The fifth and eighth M0OD layers 308a and 308d are formed parallel to the first and second portions of the fourth polysilicon layer 306a on the first side 316a of the fourth polysilicon layer 306a, respectively. Similarly, the seventh and tenth M0OD layers 308c and 308f are formed parallel to the first and second portions of the fifth polysilicon layer 306b on the first side 318a of the fifth polysilicon layer 306b, respectively. The sixth M0OD layer 308b is formed parallelly between the first portions of the fourth and fifth polysilicon layers 306a and 306b on the second sides 316b and 318b of the fourth and fifth polysilicon layers 306a and 306b, respectively. Similarly, the ninth M0OD layer 308e is formed parallelly between the second portions of the fourth and fifth polysilicon layers 306a and 306b on the second sides 316b and 318b of the fourth and fifth polysilicon layers 306a and 306b, respectively, such that the sixth and ninth M0OD layers 308b and 308e are aligned with each other.

At step 506, the second M0PO layer 312 is formed on the ninth M0OD layer 308e and the fourth and fifth polysilicon layers 306a and 306b to form an electrical contact between the ninth M0OD layer 308e and the fourth and fifth polysilicon layers 306a and 306b. At step 508, the fifth through tenth vias 310a-310f are formed on the fifth through tenth M0OD layers 308a-308f, respectively. The fifth through seventh M0OD layers 308a-308c are coupled with the first supply rail 108a by way of the fifth through seventh vias 310a-310c, respectively. Thus, the electrical contact is formed between the fifth through seventh M0OD layers 308a-308c and the first supply rail 108a by way of the fifth through seventh vias 310a-310c, respectively. Similarly, the eighth through tenth M0OD layers 308d-308f are coupled with the second supply rail 108b by way of the eighth through tenth vias 310d-310f, respectively. Thus, the electrical contact is formed between the eighth through tenth M0OD layers 308d-308f and the second supply rail 108b by way of the eighth through tenth vias 310d-310f, respectively.

The fourth and fifth polysilicon layers 306a and 306b are thus at a potential level that is equal to the potential level of the second supply rail 108b, and the fifth through seventh M0OD layers 308a-308c are at a potential level that is equal to the potential level of the first supply rail 108a. As a result, the potential differences are created between the fifth M0OD layer 308a and the fourth polysilicon layer 306a, and between the sixth M0OD layer 308b and the fourth polysilicon layer 306a. Similarly, the potential differences are created between the sixth M0OD layer 308b and the fifth polysilicon layer 306b, and between the seventh M0OD layer 308c and the fifth polysilicon layer 306b.

The potential difference between the fifth M0OD layer 308a and the fourth polysilicon layer 306a results in formation of the third parasitic capacitor PC3 therebetween. Similarly, the potential difference between the sixth M0OD layer 308b and the fourth polysilicon layer 306a results in formation of the fourth parasitic capacitor PC4 therebetween. Further, the potential difference between the sixth M0OD layer 308b and the fifth polysilicon layer 306b results in formation of the fifth parasitic capacitor PC5 therebetween, and the potential difference between the seventh M0OD layer 308c and the fifth polysilicon layer 306b results in formation of the sixth parasitic capacitor PC6 therebetween. Thus, the third through sixth parasitic capacitors PC3-PC6 are formed based on the electrical contact between the ninth M0OD layer 308e and the fourth and fifth polysilicon layers 306a and 306b, the electrical contact between the fifth through seventh M0OD layers 308a-308c and the first supply rail 108a, and the electrical contact between the ninth M0OD layer 308e and the second supply rail 108b. The third through sixth parasitic capacitors PC3-PC6 correspond to decoupling capacitors that mitigate the dynamic IR drop and the supply noise associated with the IC 100 (i.e., associated with each of the second and third functional cells 102b and 102c).

At step 510, the eleventh via 310g is formed on the sixth M0OD layer 308b. At step 512, the metal-1 layer 314 is formed on the eleventh via 310g to form an electrical contact with the sixth M0OD layer 308b. The metal-1 layer 314 is formed such that the metal-1 layer extends over the third portions of the fourth and fifth polysilicon layers 306a and 306b, the entirety of the second M0PO layer 312, and the portions of the sixth and ninth M0OD layers 308b and 308e. The metal-1 layer 314 is thus at a potential level that is equal to the potential level of the first supply rail 108a. Further, the eighth and tenth M0OD layers 308d and 308f are at a potential level that is equal to the potential level of the second supply rail 108b. Thus, the potential differences are created between the eighth M0OD layer 308d and the metal-1 layer 314, and between the tenth M0OD layer 308f and the metal-1 layer 314.

The potential difference between the eighth M0OD layer 308d and the metal-1 layer 314 results in formation of the seventh parasitic capacitor PC7 therebetween, and the potential difference between the tenth M0OD layer 308f and the metal-1 layer 314 results in formation of the eighth parasitic capacitor PC8 therebetween. Thus, the seventh and eighth parasitic capacitors PC7 and PC8 are formed based on the electrical contact between the sixth M0OD layer 308b and the metal-1 layer 314, the electrical contact between the sixth M0OD layer 308b and the first supply rail 108a, and the electrical contact between the eighth and tenth M0OD layers 308d and 308f and the second supply rail 108b. The seventh and eighth parasitic capacitors PC7 and PC8 correspond to decoupling capacitors that further mitigate the dynamic IR drop and the supply noise associated with the IC 100 (i.e., associated with each of the second and third functional cells 102b and 102c). It will be apparent to a person skilled in the art that the second integrated two-grid cell 106b is formed in a similar manner as described above.

Thus, a structure of the integrated grid cell of the present disclosure (such as the first and second integrated one-grid cells 104a and 104b and the first and second integrated two-grid cells 106a and 106b) is sans source and drain terminals and a channel formed therebetween (i.e., does not correspond to a metal-oxide-semiconductor (MOS) structure). The absence of the source and drain terminals and the channel results in the integrated grid cell of the present disclosure having a size (i.e., a width) of one and two grids (i.e., a size that is smaller than a MOS decap cell). Thus, the integrated grid cell of the present disclosure may be placed in one-grid and two-grid gaps in the layout of the IC 100. Further, such an integrated grid cell includes various parasitic capacitors (such as the first and second parasitic capacitors PC1 and PC2 and the third through eighth parasitic capacitors PS3-PS8) functioning as decoupling capacitors that mitigate the dynamic IR drop and the supply noise associated with the IC 100. Thus, the dynamic IR drop and the supply noise associated with the IC 100 including the integrated grid cell of the present disclosure is significantly less than that associated with an IC including MOS decap cells and filler cells.

As the integrated grid cell includes the parasitic capacitors functioning as decoupling capacitors, the integrated grid cell of the present disclosure may be abutted with functional cells operating at high toggling frequencies (e.g., frequencies greater than 1 gigahertz) for mitigating the dynamic IR drop and the supply noise associated therewith. In such a scenario, the one-grid and two-grid sizes of the integrated grid cell of the present disclosure ensures that a size and a manufacturing cost of the IC 100 are significantly less than that of the IC where MOS decap cells of sizes greater than two grids are abutted to functional cells operating at high toggling frequencies. Further, the parasitic capacitors associated with the integrated grid cell of the present disclosure provide additional decoupling capacitance value. Thus, a desired decoupling capacitance value is obtained in the IC 100 with the associated size and the manufacturing cost that is less than that of the IC including the MOS decap cells and the filler cells. Thus, the IC 100 including the integrated grid cell of the present disclosure is more efficient as compared to the IC including the MOS decap cells and the filler cells.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. An integrated one-grid cell, comprising:
   a first polysilicon layer;
   first through fourth metal-0 oxide diffusion (M0OD) layers, wherein the first and second M0OD layers are formed parallel to a first portion of the first polysilicon layer on first and second sides of the first polysilicon layer, respectively, and the third and fourth M0OD layers are formed parallel to a second portion of the first polysilicon layer on the first and second sides of the first polysilicon layer, respectively, wherein the first and second sides are opposite sides of the first polysilicon layer, and wherein the first and third M0OD layers are aligned with each other, and the second and fourth M0OD layers are aligned with each other; and
   a metal-0 polysilicon (M0PO) layer that is formed on the third and fourth M0OD layers and the first polysilicon layer to form an electrical contact between the third and fourth M0OD layers and the first polysilicon layer, wherein the first and second M0OD layers are coupled with a first supply rail, and the third and fourth M0OD layers are coupled with a second supply rail such that a first parasitic capacitor is formed between the first M0OD layer and the first polysilicon layer, and a second parasitic capacitor is formed between the second M0OD layer and the first polysilicon layer.

2. The integrated one-grid cell of claim 1, further comprising First and second vias formed on the first and second M0OD layers, respectively, wherein the first and second M0OD layers are coupled with the first supply rail by way of the first and second vias, respectively, and wherein an electrical contact is formed between the first and second M0OD layers and the first supply rail by way of the first and second vias, respectively.

3. The integrated one-grid cell of claim 1, further comprising third and fourth vias formed on the third and fourth M0OD layers, respectively, wherein the third and fourth M0OD layers are coupled with the second supply rail by way of the third and fourth vias, respectively, and wherein an electrical contact is formed between the third and fourth M0OD layers and the second supply rail by way of the third and fourth vias, respectively.

4. The integrated one-grid cell of claim 1, further comprising second and third polysilicon layers that are formed parallel to the first polysilicon layer such that the first and third M0OD layers are formed between the first and second polysilicon layers, and the second and fourth M0OD layers are formed between the first and third polysilicon layers.

5. The integrated one-grid cell of claim 4, wherein the integrated one-grid cell is on an integrated circuit, and a distance between the second and third polysilicon layers is equal to one grid of the integrated circuit.

6. The integrated one-grid cell of claim 4, further comprising:
   a substrate; and
   an oxide layer that is formed on the substrate, wherein the first through fourth M0OD layers and the first through third polysilicon layers are formed on the oxide layer.

7. The integrated one-grid cell of claim 1, wherein the integrated one-grid cell is on an integrated circuit, and wherein the first and second parasitic capacitors correspond to decoupling capacitors that mitigate a dynamic IR drop and a supply noise associated with the integrated circuit.

8. An integrated two-grid cell, comprising:
first and second polysilicon layers that are formed parallel to each other;
first through fourth metal-0 oxide diffusion (M0OD) layers, wherein:
the first and third M0OD layers are formed parallel to first portions of the first and second polysilicon layers on first sides of the first and second polysilicon layers, respectively,
the second M0OD layer is formed parallelly between the first portions of the first and second polysilicon layers on second sides of the first and second polysilicon layers,
the first and second sides of the first and second polysilicon layers are opposite sides, and
the fourth M0OD layer is formed parallelly between second portions of the first and second polysilicon layers on the second sides of the first and second polysilicon layers such that the second and fourth M0OD layers are aligned with each other; and
a metal-0 polysilicon (M0PO) layer that is formed on the fourth M0OD layer and the first and second polysilicon layers to form an electrical contact between the fourth M0OD layer and the first and second polysilicon layers, wherein the first through third M0OD layers are coupled with a first supply rail, and the fourth M0OD layer is coupled with a second supply rail such that a first parasitic capacitor is formed between the first M0OD layer and the first polysilicon layer, a second parasitic capacitor is formed between the second M0OD layer and the first polysilicon layer, a third parasitic capacitor is formed between the second M0OD layer and the second polysilicon layer, and a fourth parasitic capacitor is formed between the third M0OD layer and the second polysilicon layer.

9. The integrated two-grid cell of claim 8, further comprising first through fourth vias formed on the first through fourth M0OD layers, respectively, wherein the first through third M0OD layers are coupled with the first supply rail by way of the first through third vias, respectively, and the fourth M0OD layer is coupled with the second supply rail by way of the fourth via, and wherein an electrical contact is formed between the first through third M0OD layers and the first supply rail by way of the first through third vias, respectively, and an electrical contact is formed between the fourth M0OD layer and the second supply rail by way of the fourth via.

10. The integrated two-grid cell of claim 8, further comprising fifth and sixth M0OD layers that are formed parallel to the second portions of the first and second polysilicon layers on the first sides of the first and second polysilicon layers, respectively, such that the first and fifth M0OD layers are aligned with each other, and the third and sixth M0OD layers are aligned with each other.

11. The integrated two-grid cell of claim 10, further comprising fifth and sixth vias formed on the fifth and sixth M0OD layers, respectively, wherein the fifth and sixth M0OD layers are coupled with the second supply rail by way of the fifth and sixth vias, respectively, and wherein an electrical contact is formed between the fifth and sixth M0OD layers and the second supply rail by way of the fifth and sixth vias, respectively.

12. The integrated two-grid cell of claim 10, further comprising third and fourth polysilicon layers that are formed parallel to the first and second polysilicon layers such that the first and fifth M0OD layers are formed between the first and third polysilicon layers, and the third and sixth M0OD layers are formed between the second and fourth polysilicon layers.

13. The integrated two-grid cell of claim 12, wherein the integrated two-grid cell is on an integrated circuit, and a distance between the third and fourth polysilicon layers is equal to two grids of the integrated circuit.

14. The integrated two-grid cell of claim 12, further comprising:
a substrate; and
an oxide layer that is formed on the substrate, wherein the first through sixth M0OD layers and the first through fourth polysilicon layers are formed on the oxide layer.

15. The integrated two-grid cell of claim 10, wherein the integrated two-grid cell is on an integrated circuit, and the first through fourth parasitic capacitors correspond to decoupling capacitors that mitigate a dynamic IR drop and a supply noise associated with the integrated circuit.

16. The integrated two-grid cell of claim 15, further comprising:
a seventh via formed on the second M0OD layer; and
a metal-1 layer formed on the seventh via to form an electrical contact with the second M0OD layer, wherein the metal-1 layer is formed such that the metal-1 layer extends over third portions of the first and second polysilicon layers, an entirety of the M0PO layer, and portions of the second and fourth M0OD layers.

17. The integrated two-grid cell of claim 16, wherein the electrical contact between the metal-1 layer and the second M0OD layer results in formation of a fifth parasitic capacitor between the fifth M0OD layer and the metal-1 layer, and a sixth parasitic capacitor between the sixth M0OD layer and the metal-1 layer.

18. The integrated two-grid cell of claim 17, wherein the fifth and sixth parasitic capacitors correspond to decoupling capacitors that further mitigate the dynamic IR drop and the supply noise associated with the integrated circuit.

19. A method for forming an integrated one-grid cell, the method comprising:
forming a first polysilicon layer and first through fourth metal-0 oxide diffusion (M0OD) layers on an oxide layer, wherein the first and second M0OD layers are formed parallel to a first portion of the first polysilicon layer on first and second sides of the first polysilicon layer, respectively, and the third and fourth M0OD layers are formed parallel to a second portion of the first polysilicon layer on the first and second sides of the first polysilicon layer, respectively, wherein the first and second sides are opposite sides of the first polysilicon layer, and wherein the first and third M0OD layers are aligned with each other, and the second and fourth M0OD layers are aligned with each other; and
forming a metal-0 polysilicon (M0PO) layer on the third and fourth M0OD layers and the first polysilicon layer to form an electrical contact therebetween, wherein a first parasitic capacitor is formed between the first M0OD layer and the first polysilicon layer, and a second parasitic capacitor is formed between the second M0OD layer and the first polysilicon layer based on: (i) the electrical contact between the third and fourth M0OD layers and the first polysilicon layer, (ii) an electrical contact between the first and second M0OD layers and a first supply rail, and (iii) an electrical contact between the third and fourth M0OD layers and a second supply rail.

20. The method of claim 19, further comprising forming second and third polysilicon layers on the oxide layer, wherein the second and third polysilicon layers are formed parallel to the first polysilicon layer such that the first and third M0OD layers are formed between the first and second polysilicon layers, and the second and fourth M0OD layers are formed between the first and third polysilicon layers.

* * * * *